(12) United States Patent
Nakasato et al.

(10) Patent No.: US 6,887,767 B2
(45) Date of Patent: May 3, 2005

(54) METHOD FOR MANUFACTURING SEMICONDUCTOR DEVICE

(75) Inventors: Mayumi Nakasato, Ogaki (JP); Kazuhiro Sasada, Hashima (JP); Masahiro Oda, Osaka (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/392,878

(22) Filed: Mar. 21, 2003

(65) Prior Publication Data
US 2003/0181021 A1 Sep. 25, 2003

(30) Foreign Application Priority Data
Mar. 22, 2002 (JP) ........................................ 2002-080026

(51) Int. Cl.$^7$ ........................ H01L 21/76; H01L 21/762
(52) U.S. Cl. .................................. 438/426; 257/E21.55
(58) Field of Search .............................. 438/426, 425, 438/424, 297, 296, 257; 257/E21.55, 296

(56) References Cited

U.S. PATENT DOCUMENTS 6,087,243 A * 7/2000 Wang .......................... 438/424
6,187,648 B1   2/2001 Doi et al.
6,242,323 B1   6/2001 Ishitsuka et al.

FOREIGN PATENT DOCUMENTS

| CA | 1248346 A | 3/2000 |
| JP | 11-233617 | 8/1999 |
| JP | 11-274287 | 10/1999 |

* cited by examiner

Primary Examiner—Craig A. Thompson
Assistant Examiner—Monica D Harrison
(74) Attorney, Agent, or Firm—McDermott Will & Emery LLP

(57) ABSTRACT

A method for manufacturing a semiconductor device including forming a buffer film on a semiconductor substrate, forming a element partitioning trench, forming a oxidized film on the surface of the element partitioning trench, and washing the semiconductor substrate with hydrofluoric acid. The washing removes part of the buffer film, and the end of the buffer film is inwardly removed from the top edge of the element partitioning trench by a predetermined distance. The distance and the thickness of the oxidized film are represented by the expression $0 \leq x \leq (d/2 \sin \theta)$, where x represents the distance, and $\theta$ represents the angle between a plane parallel to the semiconductor substrate and a side surface of the element partitioning trench.

33 Claims, 5 Drawing Sheets

Etching Rate Of Various Films In 10%HF Solution (25C)

| Film Type | Å/min |
|---|---|
| HDP Silicon Oxide Film (No anneal) | 200 |
| HDP Silicon Oxide Film (900°C, N₂ Atmosphere / 30min anneal) | 160 |
| HDP Silicon Oxide Film (1000°C, N₂ Atmosphere / 30min anneal) | 90 |
| HDP Silicon Oxide Film (1000°C, O₂:N₂=1:4 / 30min anneal) | 80 |
| HDP Silicon Oxide Film (1100°C, N₂ Atmosphere / 30min anneal) | 85 |
| HDP Silicon Oxide Film (1100°C, O₂:N₂=1:4 / 30min anneal) | 72 |
| Thermal Oxidized Film | 70 |

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2002-080026 filed on Mar. 22, 2002, the entire contents of which are incorporated herein by reference.

BACKGROUND OF THE INVENTION

The present invention relates to a method for manufacturing a semiconductor device, and more particularly, to a method for manufacturing a semiconductor device having an element partitioning trench.

Nowadays, due to the high integration in semiconductor devices, technology for partitioning elements from each other in a semiconductor device has become important. In the element partitioning technology, the shallow trench isolation (STI) process has become more widely used than the local oxidation of silicon (LOCOS) process.

STI includes forming an element partitioning trench and embedding insulation material in the element partitioning trench. The embedded insulative material partitions element regions, which are located on opposite sides of the element partitioning trench, from each other.

The formation of the element partitioning trench normally includes the following operations: (a) applying a thin silicon oxide film on the surface of a silicon substrate, and applying a silicon nitride film on the silicon oxide film; (b) etching and removing the region in which the element partitioning trench is formed from the silicon nitride film; (c) etching the silicon substrate using the silicon nitride film, which is patterned, as a mask to form the element portioning trench on the silicon substrate; (d) oxidizing the surface of the element partitioning trench to form a thin oxidized film (silicon oxide film); (e) depositing a silicon film having a thickness that is greater than the sum of the depth of the element partitioning trench and the thickness of the silicon nitride film to embed the element partitioning trench with insulative material; (f) performing chemical-mechanical polishing using the silicon nitride film as a stopper to polish and flatten the upper surface of the silicon oxide film; and (g) etching and removing the silicon nitride film or the silicon oxide film from the silicon substrate. These operations are performed to form an element partitioning region.

When performing operation (b) or (c), the material of an inner wall of a manufacturing apparatus may be etched and be collected on the silicon substrate. To prevent the collected material from still remaining when performing operation (d), the surface of the silicon substrate and the insulative material deposited in the element partitioning trench are acid-washed with diluted hydrofluoric acid before performing operation (d). However, the acid-washing etches the silicon oxide film between the silicon substrate and the silicon nitride film. Such etching will now be discussed with reference to FIGS. 1A to 1D and 2.

Referring to FIG. 1A, a silicon oxide film 210 and then a silicon nitride film 211 are deposited on a silicon substrate 20. Afterwards, the silicon nitride film 211 is patterned. Referring to FIG. 1B, an element partitioning trench 202 is formed on the silicon substrate 201 using the patterned silicon nitride film 211 as a mask. Then, the silicon substrate 201 is washed with diluted hydrofluoric acid to remove metals collected on the silicon substrate. In this state, referring to FIG. 1C, the hydrofluoric acid horizontally removes part of the silicon oxide film 210, which is exposed to the element partitioning trench 202. Therefore, the silicon oxide film 210 is located horizontally inward from the opening in the silicon substrate 201 at each side of the element partitioning trench 202.

Referring to FIG. 1D, when the oxidized film 203 is formed in operation (d), stress is produced under the edges of the silicon oxide film 210. This forms protrusion regions 205, which are not oxidized, on the silicon substrate 201. As shown in FIG. 2, the protrusion regions 205 are not removed in the subsequent operations. Further, the protrusion regions 205 remain when forming a gate oxide film on the silicon substrate 201, which has the element partitioning region 204. The protrusion regions 205 may result in thinning and cause the thickness of the gate oxide film to be uneven. This would decrease the reliability of the semiconductor device.

Accordingly, horizontal extension of the silicon oxide film 210 into the element partitioning trench 202, as shown in FIG. 3A, has been proposed. However, in this case, deformed protrusion regions 205a are produced in the silicon substrate 201 subsequent to operation (d). The deformed protrusion regions 205a may result in thinning and decrease the reliability of the semiconductor device.

Even if washing is not performed with hydrofluoric acid, the etching of a semiconductor device having an element partitioning may decrease the reliability of the manufactured semiconductor device.

SUMMARY OF THE INVENTION

It is an object of the present invention to provide a method for manufacturing a semiconductor device having high reliability.

To achieve the above object, the present invention provides a method for manufacturing a semiconductor device. The method includes forming a buffer film on a semiconductor substrate, forming a mask having a trench formation pattern on the buffer film, forming an element partitioning trench corresponding to the trench formation pattern with the mask, and oxidizing a surface of the element partitioning trench to form an oxide film on the surface. The distance between a top edge of the element partitioning trench and an end of the buffer film is less than or equal to one half of a thickness of the oxidized film along a plane parallel to the semiconductor substrate.

A further aspect of the present invention is a method for manufacturing a semiconductor device. The method includes forming a buffer film on a semiconductor substrate, forming a mask having a trench formation pattern on the buffer film, forming an element partitioning trench corresponding to the trench formation pattern with the mask, and oxidizing a surface of the element partitioning trench to form an oxidized film on the surface of the element partitioning trench, with the buffer film being removed from a top edge of the element partitioning trench by a distance represented by the expression:

$$0 \leq x \leq (d/2 \sin \theta)$$

where x represents the removed distance of the buffer film, θ represents an angle between a plane parallel to the semiconductor substrate and a side surface of the element partitioning trench, and d represents a thickness of the oxidizing film.

A further aspect of the present invention is a method for manufacturing a semiconductor device. The method includes forming an element partitioning trench on a semiconductor substrate with a mask, filling the element partitioning trench with an insulative material, heat treating the insulative material to increase etching resistance of the insulative material, removing the mask, and forming a drive element on the semiconductor substrate.

A further aspect of the preset invention is an improvement of a method for manufacturing a semiconductor device. The method includes forming an element partitioning trench on a semiconductor substrate, filling the element partitioning trench with an insulative material, etching at least the insulative material with hydrofluoric acid, and forming a drive element on the semiconductor device. The improvement includes heat treating the insulative material to decrease the rate for etching the insulative material with the hydrofluoric acid.

A further aspect of the present invention is a method for manufacturing a semiconductor device including forming an element partitioning trench on a semiconductor substrate, filling an insulative material in the element partitioning trench, heat treating the insulative material in a stepped manner, and flattening an upper surface of the insulative material.

A further aspect of the present invention is a method for manufacturing a semiconductor device including forming a buffer film on a semiconductor substrate, forming a mask having a trench formation pattern on the buffer film, forming an element partitioning trench corresponding to the trench formation pattern with the mask, and acid-washing a surface of the element partitioning trench. The acid-washing removes part of the buffer film that is adjacent to the element partitioning trench. The buffer film is inwardly removed by a predetermined distance from a top edge of the element partitioning trench. The method also includes oxidizing the surface of the element partitioning trench to form an oxidized film on the surface. A condition of the acid-washing and a condition of the oxidizing are determined so that the predetermined distance is less than one half of a thickness of the oxidized film that is measured along a surface parallel to the semiconductor substrate.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENT

A method for manufacturing a semiconductor device according to a first embodiment of the present invention will now be discussed.

Figure 4A:
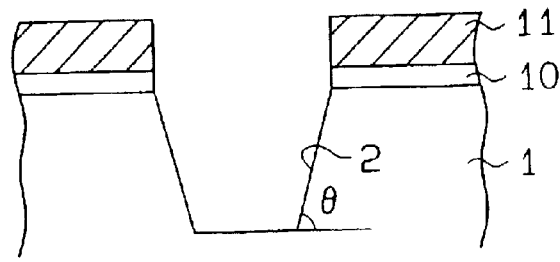
FIGS. 4A to 4D are cross-sectional views illustrating procedures for manufacturing a semiconductor device in a first embodiment of the present invention.

FIGS. 4A to 4D illustrate procedures for manufacturing a semiconductor device in the first embodiment. Referring to FIG. 4A, a silicon oxide film (buffer film) 10 having a thickness of, for example, 10 nm is applied to a semiconductor (silicon) substrate 1. A silicon nitride film 11 having a thickness of 150 nm is deposited on the silicon oxide film 10. The silicon nitride film 11 is etched and removed at a region in which an element partitioning trench is formed to form a trench formation pattern on the silicon nitride film 11. Using the silicon nitride film 11 having the trench formation pattern as a mask, the semiconductor substrate 1 is etched by, for example, 300 nm to form an element partitioning trench 2. In FIG. 4A, angle θ, which is the angle between a side surface of the element partitioning trench 2 and a horizontal plane, which is parallel to the surface of the semiconductor substrate 1, is, for example, 87 degrees.

Subsequently, an operation for washing the surface of the semiconductor substrate 1 is performed. More specifically, the semiconductor substrate 1 is washed with, for example, 0.125% of hydrofluoric acid for 30 seconds and then washed with water. Then, the semiconductor substrate 1 is washed with ammonia peroxide mixture (APM), in which the ratio of $NF_4OH:H_2O_2:H_2O$ is 0.5:1:50, and then washed with water and dried. Even if the material of an inner wall of a manufacturing apparatus, such as an etching apparatus, collects on the semiconductor substrate 1, the washing removes the collected material (metal contaminants) from the semiconductor substrate 1.

Figure 4B:
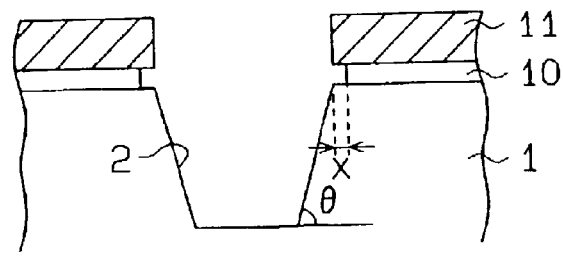

In the washing operation, as shown in FIG. 4B, hydrofluoric acid removes the edges of the silicon oxide film 10 that is exposed to the element partitioning trench 2 so that the edges are located inward from the top edge of the opening of the semiconductor substrate 1. The inwardly removed amount (removal distance) x is, for example, five angstroms.

Figure 4C:
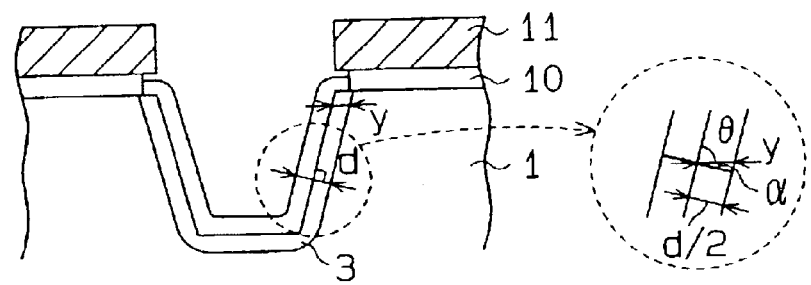

Then, referring to FIG. 4C, the semiconductor substrate 1 is heat treated for 30 minutes under an oxidizing atmosphere (the ratio of $N_2:O_2$ being 6:1) adjusted to a temperature of 1,100° C. This forms an oxidized film 3 having thickness d (20 nm) on the surface of the element partitioning trench 2.

When the surface of the element partitioning trench 2 starts oxidization, the hydrofluoric acid-washing conditions (e.g., hydrofluoric acid concentration, washing temperature, washing time) and the heat treatment (oxidizing) conditions (oxidizer concentration, oxidizing temperature, oxidizing time) are determined and set so that the removal distance x is one half (y) of the horizontal thickness of the oxidized film 3. Horizontal thickness refers to the thickness measured along the surface of the semiconductor substrate 1.

Figure 2:
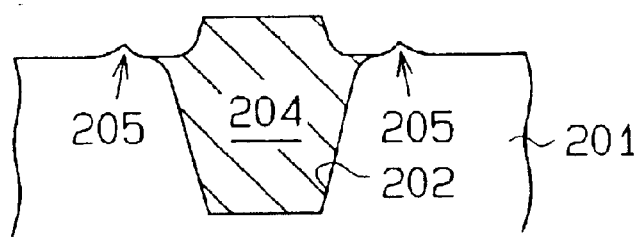
FIG. 2 is a cross-sectional view of the semiconductor device manufactured through the procedures of FIGS. 1A to 1D.
Figure 3A:
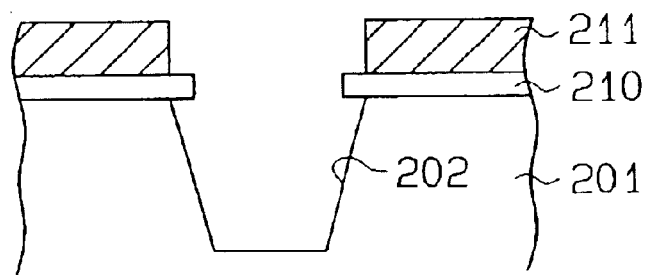
FIGS. 3A and 3B are cross-sectional views showing an example of an operation performed when manufacturing a semiconductor device in the prior art.
Figure 3B:
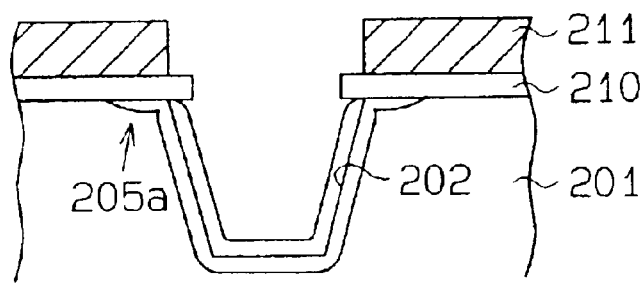

This reduces the stress applied under the edges of the silicon oxide film 10 and avoids the problems of the protrusion regions (refer to FIG. 2).

With reference to FIG. 4C, the relationship between the thickness d of the oxidized film 3 and the one half horizontal thickness y is represented by the following equation.

$$d/2 = y \times \cos\alpha = y \times \cos(90-\theta) = y \times \sin\theta$$

Accordingly, the washing conditions and the oxidizing conditions are determined so that the inwardly removed amount x of the edges of the silicon oxide film 10 from the top end of the opening of the semiconductor substrate 1 when the oxidization of the element partitioning trench 2 is started is in the following range.

$$0 \leq x \leq (d/2 \sin \theta)$$

Figure 4D:
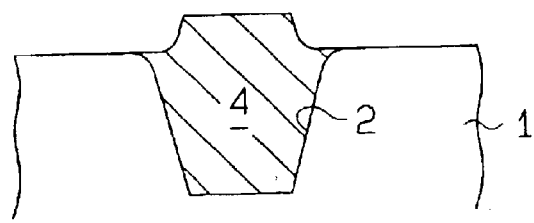

Subsequent to the formation of the oxidized film 3, for example, 600 nm of insulative material (silicon oxide film) is deposited to fill the element partitioning trench 2 with the insulative material. Then, chemical-mechanical polishing is performed using the silicon nitride film 11 as a stopper to polish and flatten the upper surface of the silicon oxide film. Phosphoric acid is used to remove the silicon nitride film 11, and hydrofluoric acid is used to remove the silicon oxide film 10. As shown in FIG. 4D, this forms the element partitioning region 4 on the semiconductor substrate 1.

Afterwards, elements, such as transistors, are formed on the semiconductor substrate 1, which is partitioned by the element partitioning region 4, through a known procedure. For example, a sacrificial oxide film is formed, and ion implanted to form a source or a drain. Hydrofluoric acid is used to remove the sacrificial oxide film and form a gate insulation film. A gate electrode, which is made of polysilicon, is formed on the gate insulation film. Then, the entire upper surface of the semiconductor substrate 1 is covered with an interlayer insulation film, which includes a silicon oxide film and a silicon nitride film. Further, for example, an aluminum alloy electrode electrically connects the gate electrode with an upper wiring layer through a contact hole.

The first embodiment has the advantages described below.

Figure 1A:
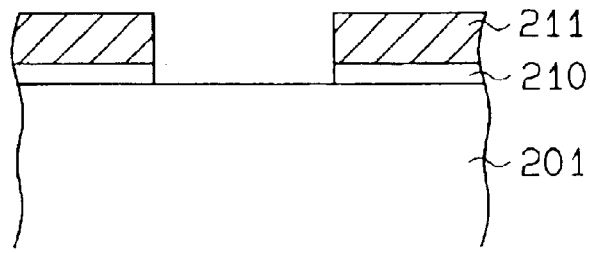
FIGS. 1A to 1D are cross-sectional views illustrating procedures for manufacturing of a semiconductor device in the prior art.
Figure 1B:
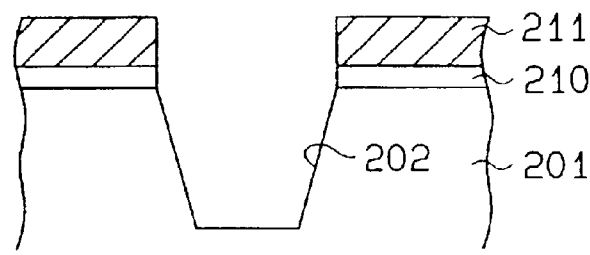
Figure 1C:
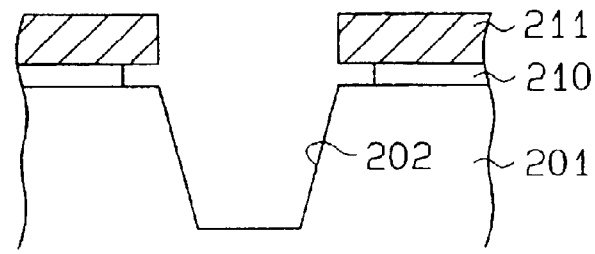
Figure 1D:
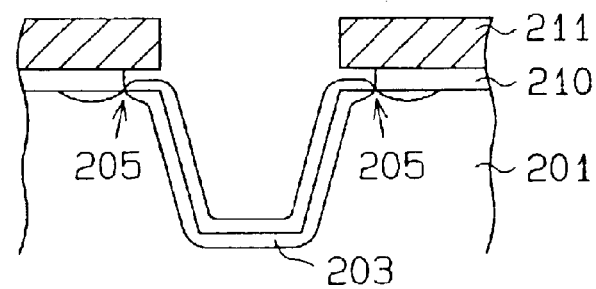

(1) The inwardly removed amount x of the silicon oxide film 10 when forming the oxidized film 3 on the surface of the element partitioning trench 2 is adjusted so that it is less than or equal to one half the horizontal thickness (y) of the oxidized film 3. In other words, the inwardly removed amount of the silicon oxide film 10 is adjusted in a range of $0 \leq x \leq (d/2 \sin \theta)$. Thus, at the point when the oxidized film 3 is formed, stress is reduced under the edges of the silicon oxide film 10, and the protrusion regions 205 (refer to FIG. 1D) are not formed. As a result, a semiconductor device having high reliability is formed.

A method for manufacturing a semiconductor device according to a second embodiment of the present invention will now be discussed.

When forming the element partitioning trench 2 and the drive elements, such as transistors, to manufacture a semiconductor device, multiple washing operations are normally performed with hydrofluoric acid. However, the washing operations (etching) etch the insulative material (silicon oxide film) embedded in the element partitioning trench. Thus, the level of the upper surface of the insulative material may become lower than the level of the semiconductor substrate 1. In this case, an electric field concentrates at the top edge of the opening (element partitioning trench 2) in the semiconductor substrate 1, and a leak current is produced. This may decrease the reliability of the semiconductor device.

In the second embodiment, heat treatment is performed to decrease the etching rate of the insulative material in the element partitioning trench with hydrofluoric acid. Thus, the level of the upper surface of the insulation material does not become lower than the level of the semiconductor substrate 1.

Figures 5, 6:
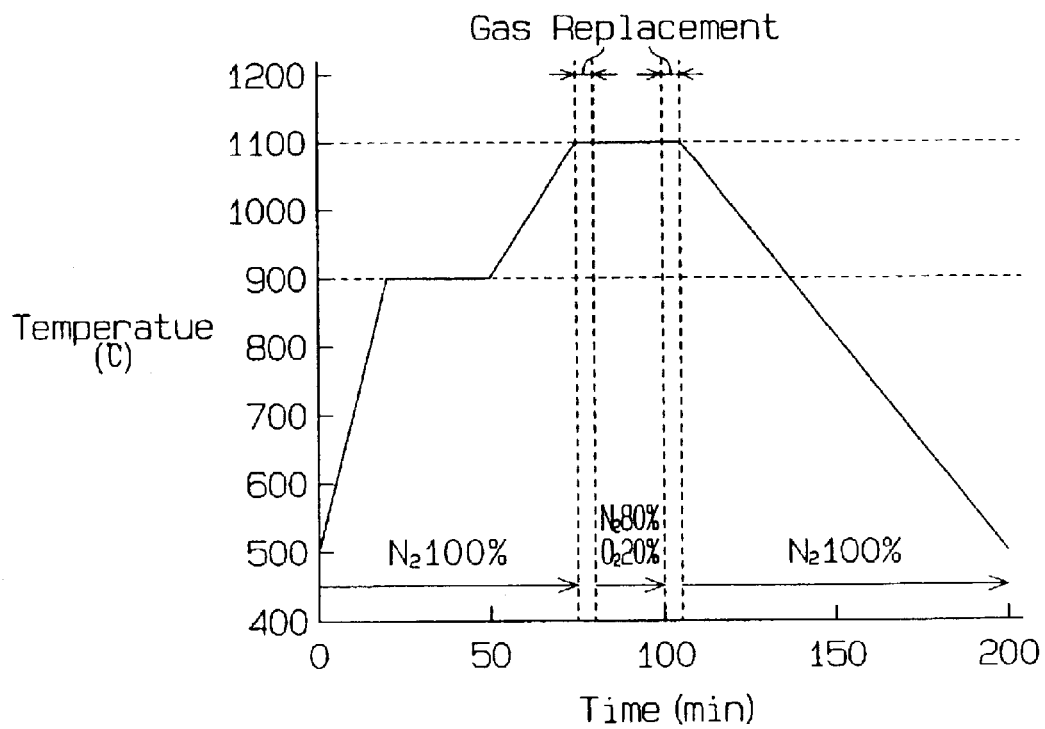
FIG. 5 is table illustrating etching rates relative to hydrofluoric acid of heat treated HDP silicon oxide film.
FIG. 6 is a time chart of stepped heat treatment in the first embodiment.

FIG. 5 is a table showing the etching rate of an HDP (high density plasma) silicon oxide film, which is formed through a high density plasma chemical vapor deposition (HDP-CVD). It is apparent that when the heat treatment (anneal) temperature increases, the etching rate of the HDP silicon oxide film decreases and the etching of the HDP silicon oxide film with hydrofluoric acid becomes difficult. It is also apparent that under the same temperature, oxygen decreases the etching rate. This is because the actual composition formula of the composition of the HDP silicon oxide film is $SiO_{2-x}$ and not $SiO_2$. In other words, although oxygen is insufficient in the actual HDP silicon oxide film, heat treatment is performed in a high temperature atmosphere, which includes oxidizer such as oxygen, to supply the HDP silicon oxide film with oxygen. As a result, the composition of the HDP silicon oxide film becomes close to $SiO_2$. In other words, the density of the HDP silicon oxide film increases by performing a heat treatment in a high temperature atmosphere that includes oxygen.

In this manner, the heat treatment increases the etching resistance of the HDP silicon oxide film and decreases the etching rate of the hydrofluoric acid. By performing the heat treatment in a high temperature atmosphere including oxygen, the density of the HDP silicon oxide film further increases and the etching rate of hydrofluoric acid further decreases. However, sudden heat treatment in an atmosphere including oxygen may suddenly change the volume of the HDP silicon oxide film. The volume change applies a large stress on the semiconductor substrate. When a large stress is applied to the semiconductor substrate, a deficiency may occur in the semiconductor substrate. This may generate leak current and decrease the reliability of the semiconductor device.

In the second embodiment, the heat treatment temperature of the HDP silicon oxide film increases in a stepped manner from a low temperature to a high temperature. This reduces the effect of the stress applied to the semiconductor substrate.

The method for manufacturing the semiconductor device in the second embodiment will now be described with reference to FIGS. 6 and 7A to 7E.

Figure 7A:
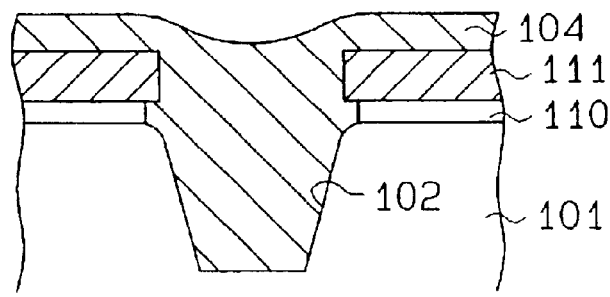
FIGS. 7A to 7E are cross-sectional views illustrating procedures for manufacturing a semiconductor device in a second embodiment of the present invention.

Referring to FIG. 7A, a thin silicon oxide film (buffer film) 110 is applied to a semiconductor (silicon) substrate 101. A silicon nitride film 111 is deposited on the silicon oxide film 110. The silicon nitride film 111 is etched to form a trench formation pattern that corresponds to an element partitioning trench. Using the silicon nitride film 111 having the trench formation pattern as a mask, the semiconductor substrate 101 is etched to form an element partitioning trench 102.

The surface of the element partitioning trench 102 undergoes heat treatment in an oxidizing atmosphere to form a silicon oxide film on the surface of the element partitioning trench 102. An HDP silicon oxide film 104, which is formed through HDP-CVD, is deposited to fill the element partitioning trench 102 with the silicon oxide film 104.

To increase the density of the HDP silicon oxide film 104, a heat treatment is performed on the HDP silicon oxide film 104. The heat treatment is performed in two steps as shown in FIG. 6. In the first step, the HDP silicon oxide film 104 is exposed to a nitrogen atmosphere at a first predetermined temperature (e.g., 900° C.) for a predetermined time (e.g., 30 minutes). Then, in the second step, the HDP silicon oxide film 104 is exposed to an atmosphere including oxygen ($N_2:O_2=4:1$) at a second predetermined temperature (e.g., 1,100° C.), which is higher than the first predetermined temperature, for a predetermined time (e.g., 20 minutes). By performing heat treatment twice at the first predetermined temperature, which is less than 1,000° C., and the second predetermined temperature, which is greater than or equal to 1,000° C., a deficient semiconductor substrate 101 is not generated, and the etching rate of hydrofluoric acid is decreased.

Figure 7B:
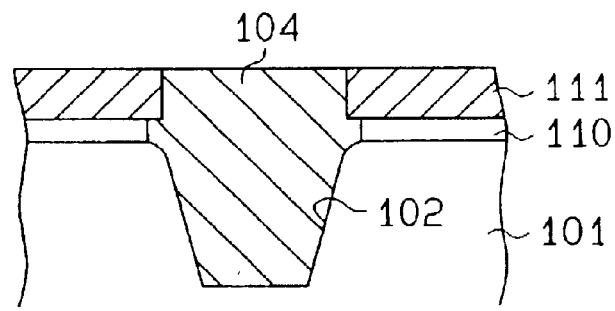
Figure 7C:
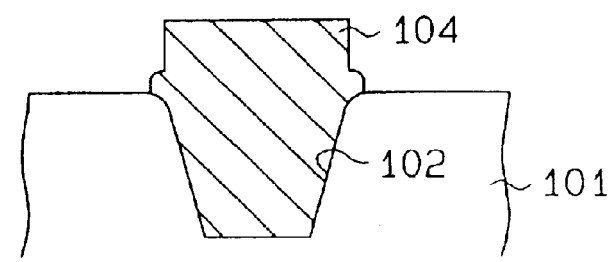

Then, referring to FIG. 7B, the silicon nitride film 111 is used as a stopper to polish and flatten the upper surface of the HDP silicon oxide film 104 through CMP. Referring to FIG. 7C, phosphoric acid is used to remove the silicon nitride film 111, and diluted hydrofluoric acid is used to remove the silicon oxide film 110.

Figure 7D:
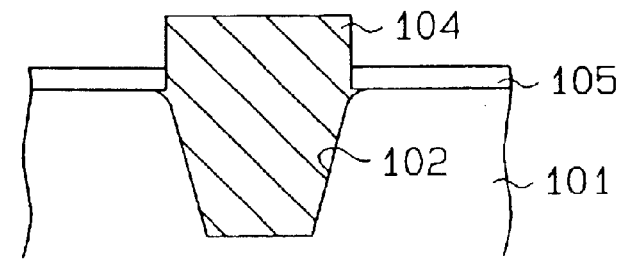
Figure 7E:
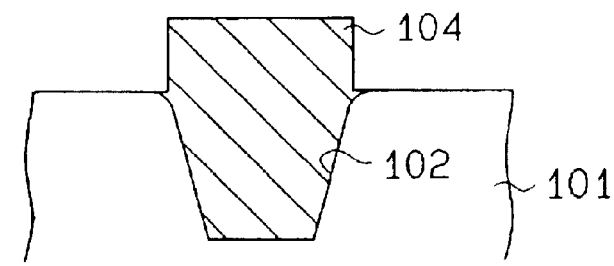

Referring to FIG. 7D, a sacrificial oxide film 105 is formed on the semiconductor substrate 101, which is partitioned by the HDP silicon oxide film 104. Ions are implanted to form a source and a drain. Referring to FIG. 7E, hydrofluoric acid is used to remove the sacrificial oxide film 105. Afterward, a gate insulation film is formed on the semiconductor substrate 101.

In this manner, the HDP silicon oxide film 104 filled in the element partitioning trench 102 undergoes the heat treatment to decrease the rate for etching the HDP silicon oxide film 104 with hydrofluoric acid. Thus, even if the silicon oxide film 110 and the sacrificial oxide film 105 are removed or etched, the level of the upper surface of the HDP silicon oxide film 104 does not become lower than the level of the upper surface of the HDP silicon oxide film 104 (upper end of the element partitioning element). In this specification, the term "etching" is not restricted to patterning using a mask, and removing and washing refers to the elimination of a predetermined member.

The second embodiment has the advantages described below.

(2) The HDP silicon oxide film 104 undergoes heat treatment to decrease the etching rate of the HDP silicon oxide film 104 with hydrofluoric acid. Thus, the level of the upper surface of the HDP silicon oxide film 104 does not become lower than the level of the semiconductor substrate 101.

(3) The HDP silicon oxide film 104 undergoes heat treatment in a stepped manner at multiple temperatures, which includes a relatively low first predetermined temperature and a relatively high second predetermined temperature. Thus, the change in the volume of the HDP silicon oxide film 104 reduces the effect of stress on the semiconductor substrate 101.

It should be apparent to those skilled in the art that the present invention may be embodied in many other specific forms without departing from the spirit or scope of the invention. Particularly, it should be understood that the present invention may be embodied in the following forms.

The trench opening patterns for forming the element partitioning trenches 2, 102 do not have to be formed in the silicon nitride films 11 and 111.

The buffer film, which absorbs the stress produced between the films 11 and 111 that have the trench opening pattern and the semiconductor substrates 1 and 101, is not limited to the silicon oxide films 10 and 110.

In the first embodiment, a compound other than hydrofluoric acid may be used in the washing operation, which is performed before the oxidization of the element partitioning trench 2.

In the second embodiment, in addition to the nitride atmosphere, an atmosphere that does not include oxygen may be, for example, an argon atmosphere.

In the second embodiment, the heat treatment of the first step, which is performed at a relatively low temperature, may be performed in an atmosphere that does not include oxygen. This increases the density of the HDP silicon oxide film 104.

In the second embodiment, the heat treatment temperature of the HDP silicon oxide film 104 is not limited to two steps and may be performed in three or more steps.

The insulative material filling the element partitioning trench is not limited to silicon oxide or HDP silicon oxide.

When removing a mask or forming a drive element, an etchant other than hydrofluoric acid may be used. In this case, the heat treatment of the insulative material increases the density of the insulative material and decreases the etching rate. Further, when the insulative material undergoes multiple stages of heat treatment, the effect of stress resulting from changes in the volume of the insulative material is reduced.

The present examples and embodiments are to be considered as illustrative and not restrictive, and the invention is not to be limited to the details given herein, but may be modified within the scope and equivalence of the appended claims.

What is claimed is:

1. A method for manufacturing a semiconductor device, the method comprising:

forming a buffer film on a semiconductor substrate;

forming a mask having a trench formation pattern on the buffer film;

forming an element partitioning trench corresponding to the trench formation pattern with the mask; and oxidizing a surface of the element partitioning trench to form an oxidized film on the surface, wherein the distance between a top edge of the element partitioning trench and an end of the buffer film is less than or equal to one half of a thickness of the oxidized film along a plane parallel to the semiconductor substrate.

2. The method according to claim 1, further comprising:

washing at least the surface of the element partitioning trench prior to said oxidizing, wherein a condition of said washing is determined so that the distance is equal to a predetermined value.

3. The method according to claim 2, wherein a condition for forming the oxidized film is set so that one half of the thickness of the oxidized film is less than or equal to the distance.

4. A method for manufacturing a semiconductor device, the method comprising:

forming a buffer film on a semiconductor substrate;

forming a mask having a trench formation pattern on the buffer film;

forming an element partitioning trench corresponding to the trench formation pattern with the mask; and oxidizing a surface of the element partitioning trench to form an oxidized film on the surface of the element partitioning trench, wherein prior to said oxidizing, the buffer film is removed from a top edge of the element partitioning trench by a distance represented by the expression:

$$0 \leq x \leq (d/2 \sin \theta)$$

where x represents the removed distance of the buffer film, $\theta$ represents an angle between a plane parallel to the semiconductor substrate and a side surface of the element partitioning trench, and d represents a thickness of the oxidized film.

5. The method according to claim 4, further comprising:

washing at least the surface of the element partitioning trench prior to said oxidizing, wherein a condition of said washing is determined so that the distance is equal to a predetermined value.

6. The method according to claim 5, wherein a condition of said oxidizing is determined so that the thickness of the oxidized film and the distance satisfy the expression.

7. A method for manufacturing a semiconductor device, the method comprising:

forming an element partitioning trench on a semiconductor substrate with a mask;

filling the element partitioning trench with an insulative material;

heat treating, after said filling operation, the insulative material to increase etching resistance of the insulative material;

removing the mask after said heat treating operation; and forming a drive element on the semiconductor substrate.

8. The method according to claim 7, wherein said removing the mask and said forming a drive element includes etching.

9. The method according to claim 7, wherein said heat treating includes increasing the density of the insulative material.

10. An improvement of a method for manufacturing a semiconductor device, wherein the method includes forming an element partitioning trench on a semiconductor substrate, filling the element partitioning trench with an insulative material, forming a drive element on the semiconductor device, and performing etching with hydrofluoric acid between said forming an element partitioning trench and said forming a drive element, the improvement comprising:

heat treating the insulative material to decrease the rate for etching the insulative material with the hydrofluoric acid by exposing the insulative material in the trench to a first atmosphere at a first elevated temperature for a first predetermined period; and thereafter exposing the insulative material in the trench to a second atmosphere at a second elevated temperature for a second predetermined period, wherein the second elevated temperature is higher than the first elevated temperature.

11. The method according to claim 10, wherein said heat treating includes heat treating at a temperature of 1,000° C. or greater.

12. The method according to claim 11, wherein the first elevated temperature is at a temperature less than 1,000° C. and the second elevated temperature is at a temperature of 1,000° C. or greater.

13. A method for manufacturing a semiconductor device comprising:

forming an element partitioning trench on a semiconductor substrate;

filling an insulative material in the element partitioning trench; and heat treating the insulative material in a plurality of steps to reduce stress that is produced by volume change of the insulative material, wherein one step includes exposing the insulative material to a first atmosphere at a first temperature for a first predetermined period, and another step includes exposing the insulative material in a second atmosphere at a second temperature for a second predetermined period, the second temperature being higher than the first temperature.

14. The method according to claim 13, wherein the first temperature is less than 1,000° C., and the second temperature is 1,000° C. or greater.

15. The method according to claim 13, wherein the insulative material is a silicon oxide film, and said exposing the insulative material at a second temperature is performed in an atmosphere including oxygen and inert gas.

16. A method for manufacturing a semiconductor device comprising:

forming an element partitioning trench on a semiconductor substrate;

filling an insulative material in the element partitioning trench;

heat treating the insulative material in a plurality of steps, wherein one step includes exposing the insulative material to a first atmosphere at a first temperature for a predetermined period, and another step includes exposing the insulative material in a second atmosphere at a second temperature for a second predetermined period, the second temperature being higher than the first temperature; and flattening an upper surface of the insulative material.

17. The method according to claim 16, wherein the insulative material is a high density plasma silicon oxide film, and said heat treating includes maintaining the insulative material at the first temperature under an atmosphere that does not include oxygen, and then maintaining the insulative material at the second temperature under an atmosphere that includes oxygen gas.

18. The method according to claim 17, wherein the first temperature is less than 1,000° C., and the second temperature is 1,000° C. or greater.

19. A method for manufacturing a semiconductor device comprising:

forming a buffer film on a semiconductor substrate;

forming a mask having a trench formation pattern on the buffer film;

forming an element partitioning trench corresponding to the trench formation pattern with the mask;

acid-washing a surface of the element partitioning trench, wherein said acid-washing removes part of the buffer film that is adjacent to the element partitioning trench, the buffer film being inwardly removed by a predetermined distance from a top edge of the element partitioning trench; and oxidizing the surface of the element partitioning trench to form an oxidized film on the surface, wherein a condition of said acid-washing and a condition of said oxidizing are determined so that the predetermined distance is less than or equal to one half of a thickness of the oxidized film that is measured along a surface parallel to the semiconductor substrate.

20. A method for manufacturing a semiconductor device, the method compromising:

forming a buffer film on a semiconductor substrate;

forming a mask having a trench formation pattern on the buffer film;

forming an element partitioning trench corresponding to the trench formation pattern with the mask; and oxidizing a surface of the element partitioning trench to form an oxidized film on the surface, wherein prior to said oxidizing, an end of the buffer film is removed from a top edge of the element partitioning trench by an adjusted distance that is less than or equal to one half of a thickness of the oxidized film along a plane parallel to the semiconductor substrate.

21. The method according to claim 10, wherein said heat treating includes gradually elevating the temperature from the first temperature to the second temperature.

22. The method according to claim 21, wherein the second predetermined period is equal to or shorter than the first predetermined period.

23. The method according to claim 21, wherein the insulative material is exposed at a temperature that is higher than the first temperature for a period that is longer than the predetermined period.

24. The method according to claim 10, wherein the first atmosphere is an atmosphere that includes an inert gas and does not include oxygen, and the second atmosphere is an atmosphere that includes an inert gas and oxygen.

25. The method according to claim 24, wherein the inert gas is nitrogen.

26. The method according to claim 13, wherein said heat treating includes gradually elevating the temperature from the first temperature to the second temperature.

27. The method according to claim 26, wherein the second predetermined period is equal to or shorter than the first predetermined period.

28. The method according to claim 26, wherein the insulative material is exposed at a temperature that is higher than the first temperature for a period that is longer than the first predetermined period.

29. The method according to claim 15, wherein the first atmosphere is an atmosphere that includes an inert gas and does not include oxygen.

30. The method according to claim 28, wherein the inert gas is nitrogen.

31. The method according to claim 16, wherein said heat treating includes gradually elevating the temperature from the first temperature to the second temperature.

32. The method according to claim 31, wherein the second predetermined period is equal to or shorter than the first predetermined period.

33. The method according to claim 31, wherein the insulative material is exposed at a temperature that is higher than the first temperature for a period that is longer than the first predetermined period.

* * * * *